(12) United States Patent
Lai et al.

(10) Patent No.: US 6,542,364 B2
(45) Date of Patent: Apr. 1, 2003

(54) HEAT DISSIPATING ASSEMBLY WITH HEAT PIPES

(75) Inventors: Cheng Tien Lai, Taipei (TW); Shuai Jiang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/951,814

(22) Filed: Sep. 12, 2001

(65) Prior Publication Data

US 2003/0011990 A1 Jan. 16, 2003

(30) Foreign Application Priority Data

Jul. 12, 2001 (TW) .......................................... 90211757 U

(51) Int. Cl.[7] ................................................. H05K 7/20
(52) U.S. Cl. ...................... 361/697; 174/15.1; 165/121; 165/104.33; 257/715; 257/722; 361/700; 361/703
(58) Field of Search ......................... 165/80.3, 121–122, 165/104.21, 104.33; 174/15.1; 257/715–716, 722; 361/687, 694–704, 707, 715

(56) References Cited

U.S. PATENT DOCUMENTS

| 4,204,246 A | * | 5/1980 | Arii et al. ................ 361/700 |
| 5,925,929 A | * | 7/1999 | Kuwahara et al. ......... 257/722 |

* cited by examiner

*Primary Examiner*—Gregory Thompson
(74) *Attorney, Agent, or Firm*—Wei Te Chung

(57) ABSTRACT

A heat dissipating assembly (1) includes a pair of concertinaed heat pipes (10), a plurality of fins (20), a shell (30), a heat-conductive block (40) and a fan (50). The fins are spaced and stacked one above the other. A plurality of channels (22) is defined through opposite sides of the fins, for insertion of the heat pipes thereinto. The shell includes a frame (32) and a cover (34) mounted to a top side of the frame, thereby defining a space for accommodating the fins and the heat pipes therein. A plurality of openings (362, 342) is defined in a bottom plate (36) of the frame and in the cover, for extension of bottommost and topmost portions of the heat pipes therethrough. A horizontal end portion (12) of each heat pipe extends over the cover and engages with the block. The fan is mounted to one end of the shell.

6 Claims, 3 Drawing Sheets

HEAT DISSIPATING ASSEMBLY WITH HEAT PIPES

BACKGROUND OF THE INVENTION

1. Field of the Invention

The present invention relates to cooling of electronic devices, and particularly to heat dissipating assemblies incorporating heat pipes for more efficiently dissipating heat from electronic devices.

2. Prior Art

Developments in today's highly information-intensive society have led to remarkable improvements in performances of electronic devices. During operation of many contemporary electronic devices, large amounts of heat are produced. A conventional heat sink formed by extrusion is frequently no longer able to satisfactorily remove heat from modern high-speed electronic devices.

As thermal loads of electronic devices continue to increase, so therefore more effective ways to cool such devices have been sought. One apparatus developed to cool high-speed electronic devices is illustrated in FIG. 3. A heat dissipating assembly 2 comprises a heat-conductive block 3, a heat sink 4 and a heat pipe 5. The heat-conductive block 3 is attached onto a surface of a heat-generating element (not shown) to absorb heat therefrom. One end of the heat pipe 5 is connected to the heat-conductive block 3. The other end of the heat pipe 5 is placed above and across the heat sink 4. The heat sink 4 includes a plurality of parallel heat-dissipating fins 6. A through hole (not labeled) is defined through a middle of the fins 6, for extension of the heat pipe 5 therethrough. Unfortunately, in assembly, the heat pipe 5 must be inserted into the through hole through each fin 6 one by one. Then each fin 6 is fixed to the heat pipe 5 by spot welding. This process is cumbersome and time-consuming. In addition, the heat pipe 5 contacts each fin 6 at one point only. This does not take full advantage of the high heat conductivity of the heat pipe 5, nor of the available area of contact of each fin 6. Furthermore, the assembly 2 dissipates heat by natural air convection only, with no means for enhancing such convection. An example of the above-described assembly is disclosed in Taiwan Patent No. 409886.

Therefore, an improved heat dissipating assembly for an electronic device which overcomes the above problems is desired.

BRIEF SUMMARY OF THE INVENTION

Accordingly, an object of the present invention is to provide a heat dissipating assembly which is easily assembled.

Another object of the present invention is to provide a heat dissipating assembly which utilizes a plurality of concertinaed heat pipes to attain optimal heat transfer efficiency.

To achieve the above-mentioned objects, a heat dissipating assembly comprises a pair of concertinaed heat pipes, a plurality of fins, a shell, a heat-conductive block and a fan. The fins are spaced and stacked one above the other. A plurality of channels is defined through opposite sides of the stack of fins, for insertion of the heat pipes thereinto. The shell comprises a frame and a cover mounted to a top side of the frame, thereby defining a space for accommodating the stack of fins and the heat pipes therein. A plurality of first and second openings is defined in a bottom plate of the frame and in the cover respectively, for extension of bottommost and topmost portions of the heat pipes therethrough respectively. A horizontal end portion of each heat pipe extends over the cover and engages with the block. The fan is mounted to one end of the shell, to provide forced air convection.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
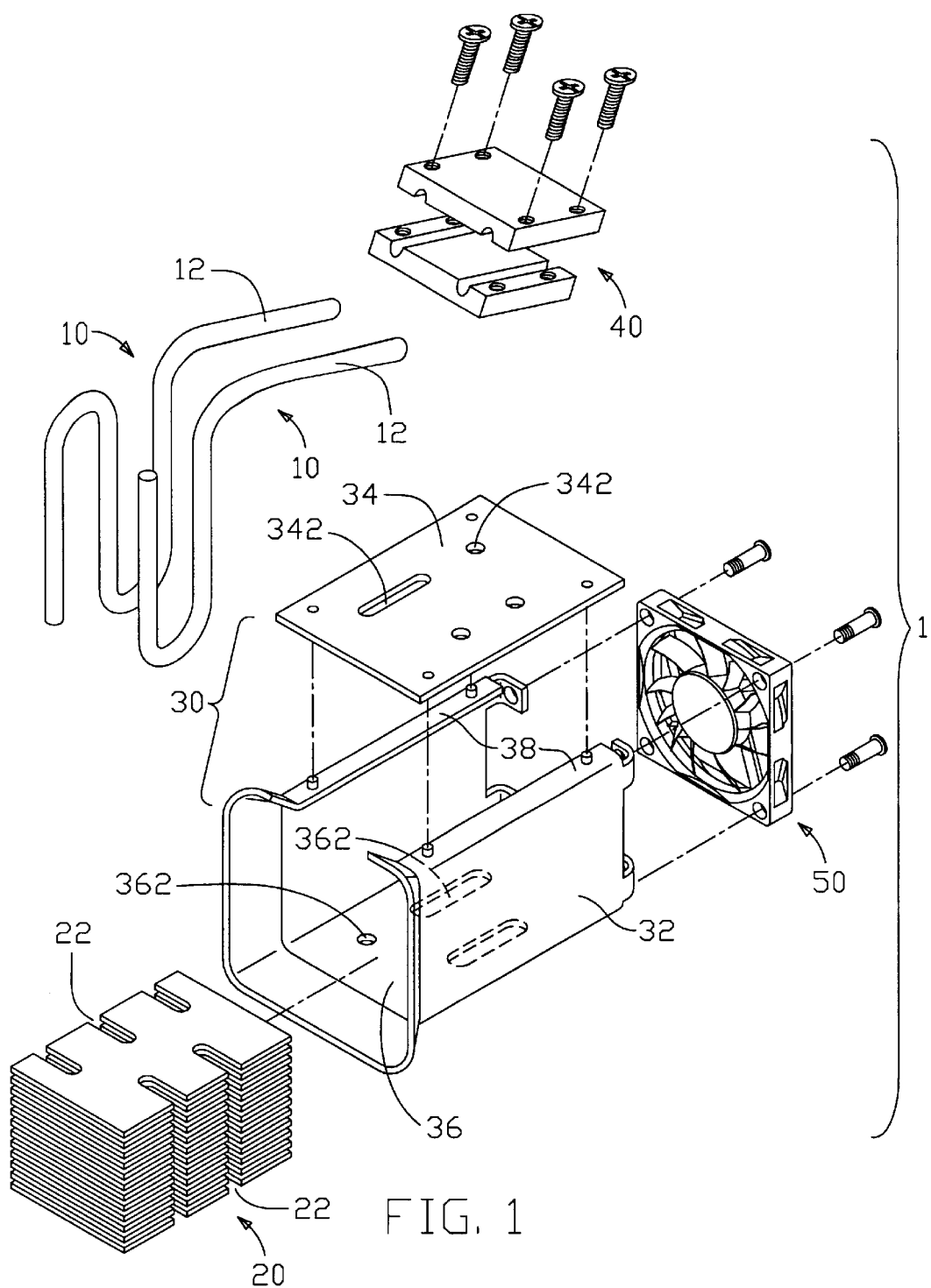
FIG. 1 is an exploded view of a heat dissipating assembly in accordance with the present invention.
Figure 2:
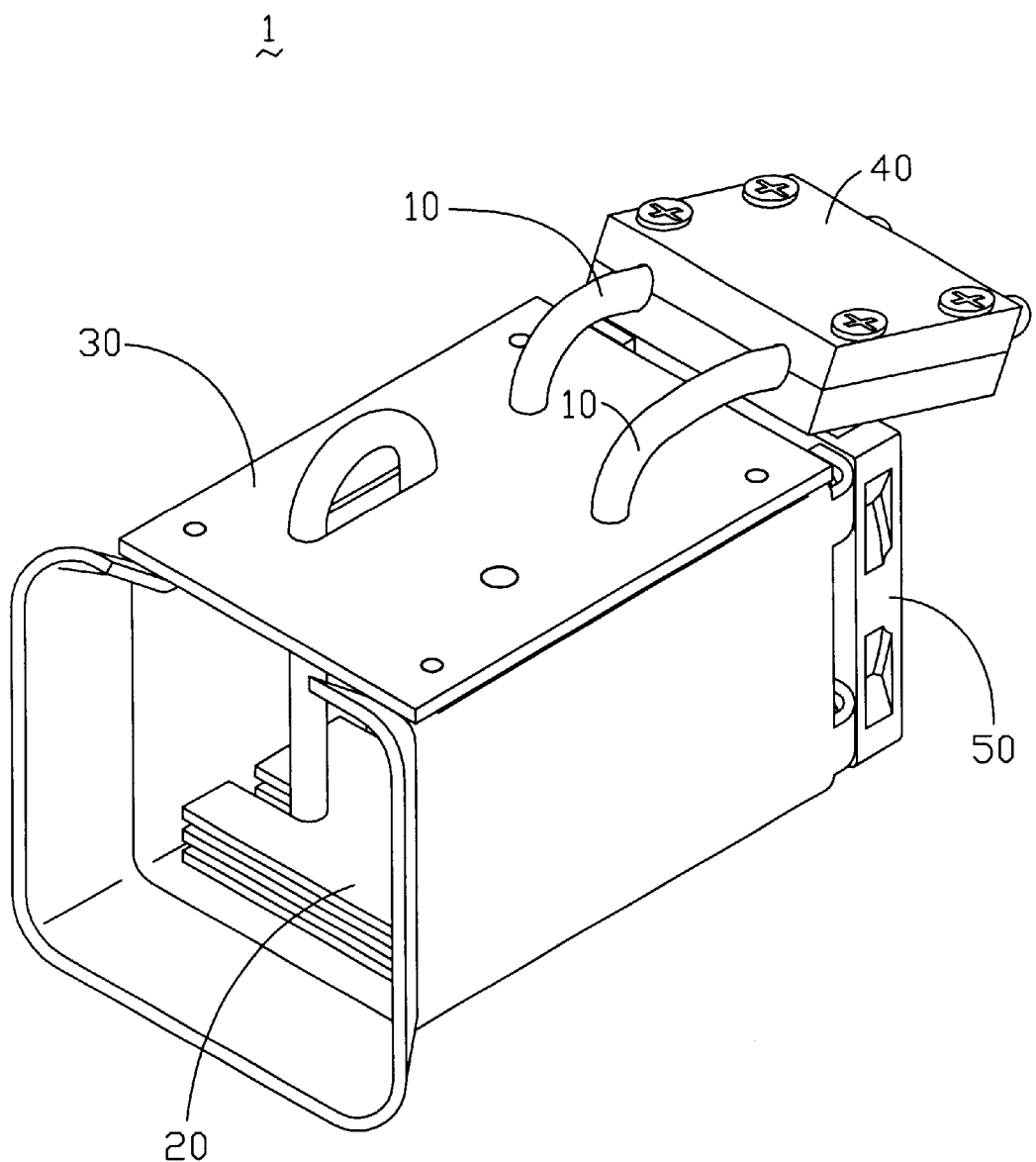
FIG. 2 is an assembled view of FIG. 1.
Figure 3:
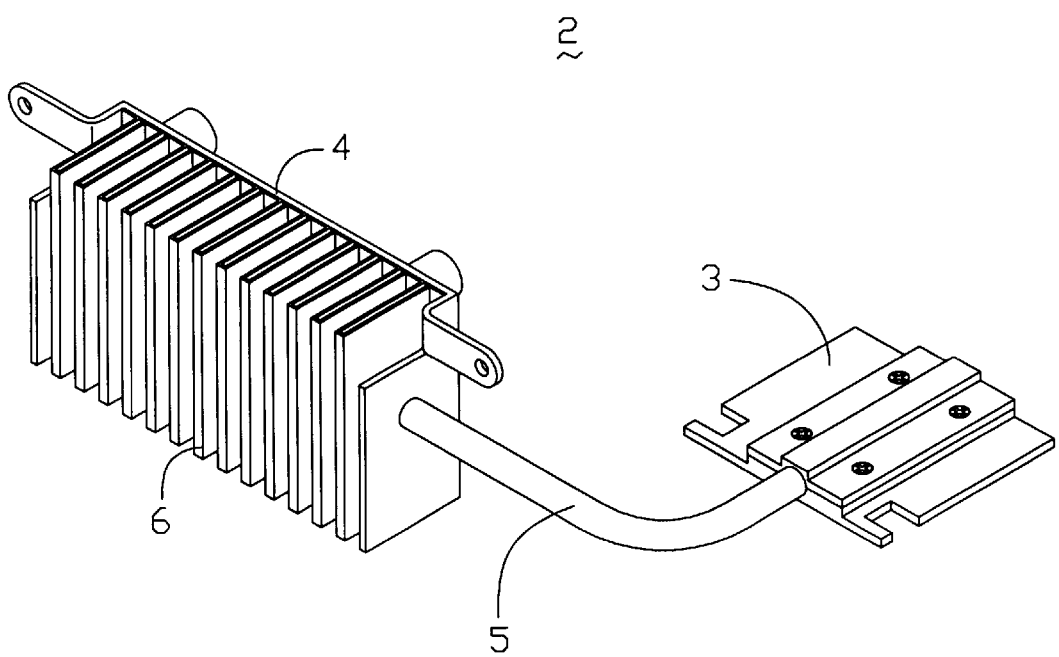
FIG. 3 is an assembled view of a conventional heat dissipating assembly.

Referring to FIGS. 1 and 2, a heat dissipating assembly 1 in accordance with the present invention comprises a pair of concertinaed heat pipes 10, a plurality of heat dissipating fins 20, a shell 30, a heat-conductive block 40 and a fan 50. The heat-conductive block 40 is attached to a top surface of a CPU (not shown), to conduct heat from the CPU. The heat is then transferred to the fins 20 via the heat pipes 10.

Each heat pipe 10 has a generally horizontal end portion 12, and a generally concertinaed portion integrally joined with the end portion 12. One heat pipe 10 has a vertical U-shaped concertinaed portion integrally joined with the end portion 12. The other heat pipe 10 is similar to the first heat pipe 10, but has an extra vertical portion integrally joined with a free end of the U-shaped portion.

The fins 20 are spaced and stacked one above the other. A plurality of channels 22 is defined through opposite longitudinal sides of the stack of fins 20. The channels 22 are perpendicular to the fins 20. The channels 22 are spaced in a staggered fashion such that any one channel 22 at one side of the stack of fins 20 is not directly opposite a nearest channel 22 at an opposite side of the stack of fins 20, but rather diagonally opposite such nearest channel 22.

The shell 30 is generally box-shaped, and comprises a frame 32 and a cover 34 mounted to a top side of the frame 32. The frame 32 has a bottom plate 36, and two side plates (not labeled) extending upwardly from opposite longitudinal sides of the bottom plate 36. Two flanges 38 extend toward each other from top edges of the side plates (not labeled) respectively. The frame 32 and the cover 34 together define a space (not labeled) for accommodating the heat pipes 10 and the stack of fins 20 therein. A plurality of first openings 362 is defined in the bottom plate 36, for extension of the heat pipes 10 therethrough. A plurality of second openings 342 is defined in the cover 34, corresponding to the first openings 362 of the bottom plate 36. Some of the first and second openings 362, 342 are circular, and have a diameter slightly larger than a diameter of the corresponding heat pipe 10. Other first and second openings 362, 342 are slot-shaped, and correspond to bent portions of the heat pipes 10. The fan 50 is attachable to one end of the shell 30, to provide forced air convection. The shell 30 also functions as a fan duct, to guide forced air provided by the fan 50.

In assembly, one of the heat pipes 10 is interferentially inserted into the channels 22 at one side of the stack of fins 22. The other heat pipe 10 is interferentially inserted into the channels 22 at the opposite side of the stack of fins 22. The end portions 12 of the heat pipes 10 protrude above and beyond a topmost fin 20. The end portions 12 are generally parallel to each other. Bottommost portions of the heat pipes 10 protrude below a bottommost fin 20. Then, the combined stack of fins 20 and heat pipes 10 is inserted into the space (not labeled) inside the shell 30. The bottommost portions of the heat pipes 10 are fittingly received in the first openings 362 of the bottom plate 36 of the frame 32. The cover 34 is slid over the end portions 12 of the heat pipes 10 until the cover 34 has reached a horizontal position. Topmost portions of the heat pipes 10 are thus fittingly received in the corresponding second openings 342 of the cover 34. The cover 34 is then mounted on the flanges 38 of the frame 32 by conventional means. The end portions 12 of the heat pipes 10 are engaged within the heat-conductive block 40 by conventional means. The fan 50 is mounted to one end of the frame 32 of the shell 30 by conventional means such as screws.

The heat dissipating assembly of the present invention includes at least the following advantages. Each heat pipe 10 is accommodated in at least two channels 20 of the stack of fins 20. This increases an overall heat conduction area of the heat pipes 10, and results in uniform conduction of heat from the fins 20. A heat transfer coefficient of the heat pipes 10 is accordingly increased. In addition, the shell 30 functions as a fan duct. The fan 50 mounted at one end of the frame 32 of the shell 30 provides forced airflow which is parallel to the fins 20. Thus there is low airflow resistance and optimal ventilation. Furthermore, the concertinaed heat pipes 10 are easily inserted into the channels 22 of the stack of fins 20. This eliminates the cumbersome process of inserting a heat pipe through an array of fins one by one.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat dissipating assembly comprising:

a concertinaed heat pipe;

a plurality of fins, a plurality of channels being defined in one side of the fins for fittingly receiving the heat pipe therein;

a shell accommodating the fins and the heat pipe therein, an end portion of the heat pipe protruding out of the shell;

a heat-conductive block adapted to be attached to a heat generating electronic device, the block engaging with the end portion of the heat pipe and transferring heat to the fins via the heat pipe; and a fan attached to one end of the shell, the fan providing forced airflow through the shell.

2. The heat dissipating assembly as described in claim 1, wherein the fins are spaced and stacked one above the other.

3. The heat dissipating assembly as described in claim 1, wherein the shell comprises a frame, the frame has a bottom plate and a pair of side plates extending upwardly from opposite sides of the bottom plate, the frame also has a pair of flanges extending from the side plates toward each other, and wherein the shell further comprises a cover mounted onto the flanges.

4. The heat dissipating assembly as described in claim 3, wherein at least one first opening is defined in the bottom plate of the frame for accommodating at least one bottommost portion of the heat pipe protruding beyond a bottommost fin of said fins.

5. The heat dissipating assembly as described in claim 3, wherein the cover defines at least one second opening for extension of at least one topmost portion of the heat pipe protruding beyond a topmost fin of said fins.

6. The heat dissipating assembly as described in claim 1, wherein the heat dissipating assembly comprises two concertinaed heat pipes, and a plurality of channels is defined in each of opposite sides of the fins for fittingly receiving the heat pipes therein.

\* \* \* \* \*